United States Patent [19]

Potter

[11] 4,317,092

[45] Feb. 23, 1982

[54] RECURSIVE LOW PASS DIGITAL FILTER

[75] Inventor: Ronald W. Potter, Saratoga, Calif.

[73] Assignee: Hewlett-Packard Company, Palo Alto, Calif.

[21] Appl. No.: 164,411

[22] Filed: Jun. 30, 1980

[51] Int. Cl.³ .................... H03H 17/04; H03H 11/12
[52] U.S. Cl. .................................. 333/165; 328/151; 333/166; 364/724
[58] Field of Search ........................ 333/165, 166, 167; 328/150–151, 167; 307/221 C, 221 D, 520, 521; 364/724

[56] References Cited

U.S. PATENT DOCUMENTS 3,599,108  8/1971  Gardner .............................. 333/166
3,622,916  11/1971  Fjallbrant .......................... 328/167

Primary Examiner—Marvin L. Nussbaum
Attorney, Agent, or Firm—Edward Y. Wong

[57] ABSTRACT

A recursive digital low-pass filter processes an input signal with essentially unity gain and sharp frequency cutoff without using multipliers to provide an output signal with an information bandwidth substantially one-half that of the input signal.

5 Claims, 21 Drawing Figures $$H_0(z) = \frac{Y(z)}{X(z)} = \frac{z^2}{z^2+.5}$$

$$H_1(Z) = \frac{Y(Z)}{X(Z)} = \frac{Z+1}{Z}$$

$$H_2(Z) = \frac{Y(Z)}{X(Z)} = \frac{Z^2+Z+1}{Z^2}$$

$$H_2(Z) = \frac{Y(Z)}{X(Z)} = \frac{Z^2+Z+1}{Z^2}$$

$$H_2(Z) = \frac{Y(Z)}{X(Z)} = \frac{Z^2+Z+1}{Z^2}$$

$$H_2(Z) = \frac{Y(Z)}{X(Z)} = \frac{Z^2+Z+1}{Z^2}$$

$$H_3(Z) = \frac{Y(Z)}{X(Z)} = \frac{Z^3 + 2Z^2 + 2Z + 1}{Z^3}$$

$$H_3(Z) = \frac{Y(Z)}{X(Z)} = \frac{Z^3 + 2Z^2 + 2Z + 1}{Z^3}$$

$$H_3(Z) = \frac{Y(Z)}{X(Z)} =$$

$$\frac{Z^3 + 2Z^2 + 2Z + 1}{Z^3}$$

$$H_3(Z) = \frac{Y(Z)}{X(Z)} = \frac{Z^3 + 2Z^2 + 2Z + 1}{Z^3}$$

$$H_3(Z) = \frac{Y(Z)}{X(Z)} = \frac{Z^3 + 2Z^2 + 2Z + 1}{Z^3}$$

$$H_4(Z) = \frac{Z^2 + Z + 1}{Z^2 + .5}$$

$$H(Z) = \frac{Z^3 + 2Z^2 + 2Z + 1}{Z(Z^2 + .5)} = \frac{(Z^2 + Z + 1)(Z + 1)}{Z(Z^2 + .5)}$$

RECURSIVE LOW PASS DIGITAL FILTER

BACKGROUND OF THE INVENTION

This invention relates to digital filters and, more particularly, to recursive digital filters. A digital filter typically filters or otherwise conditions digital signals or words applied to it. The filtered digital signals or words may then be further processed by other equipment to extract information contained therein.

In the prior art, it has frequently been difficult and impractical to implement recursive filters due to multiplier requirements. Multipliers are required for multiplying the digital input signal by digital coefficients to effect a filter with desirable filter characteristics such as a flat frequency response, a sharp frequency cutoff, a low insertion loss, and the like. See, for example, Patkay, et al., "Front End Design for Digital Signal Analysis", *Hewlett-Packard Journal*, p. 10, October 1977. This multiplication process typically requires complex circuits and long sequences of repetitive operations. Such long sequences of operations inherently limit the maximum operating speed of the filter. When the digital word size of the input signal is long, or when high resolution is required, the circuits become more complex and the limitation on the speed of operation becomes more severe. To minimize these difficulties, use of memory storage devices to replace the requirement for multipliers have been attempted. For example, Betts, in U.S. Pat. No. 4,125,900, and Delforge, in U.S. Pat. No. 4,146,931, both implement a digital filter using this approach. Even with the use of memory storage devices, these attempts to fabricate recursive digital filters nevertheless result in expensive filter structures of large physical size and large memory storage capacity.

SUMMARY OF THE INVENTION

The preferred embodiment of the present invention provides a recursive digital filter which utilizes a combination of adders and storage registers to overcome the requirement of complex multipliers. The filter output has half the information bandwidth of the input to the filter. Also, the filter has desirable filter response characteristics like essentially unity gain, substantially flat pass-band response, and a sharp frequency cutoff.

In accordance with the preferred embodiment, a digital signal comprising a sequence of digital words is input to a low-pass digital filter section comprising storage registers and adders. Therein, the digital signal is delayed by the storage registers and is summed with feedback and feedforward signals by the adders. By scaling the output signal of the adders, that is, by redesignating a bit as the most significant bit in the digital word, appropriate scaling of the digital signal is further accomplished.

The combination of summing the input signal with feedback and feedforward signals derived from the input signal and scaling and recombining the resultant summed signal eliminates the need for multipliers. Yet, the desirable filter characteristics are still realized. The sharp frequency cutoff characteristic is especially important because it minimizes the problem of aliasing. By having sharp frequency cutoffs, the digital signal processed by the digital filter will be effectively bandlimited. Thus, when the signal is resampled, there will be minimal overlapping of spectral components, or aliasing. When the signal is reconstructed, the overlapping of spectral components will not substantially distort the information content of the signal and become problematic.

Specifically, the preferred embodiment of the invention realizes a digital filter having a transfer function $H(z)$, $$H(z) = A \frac{0.25(z^2 + z + 1)(z + 1)}{z^n(z^2 + 0.5)} \tag{1}$$

where:
- $z = e^{s\Delta t}$, which represents a time advance of $\Delta t$ seconds;
- $s$ is the complex variable associated with the LaPlace transform;
- $A$ is a scaling factor of a predetermined magnitude; and
- $n$ is a predetermined integer representing the number of $\Delta t$ delays built into the filter. It has no effect upon the magnitude of the transfer characteristic.

The denominator of the transfer function represents the feedback signal in the filter section, and the numerator represents the feedforward signals. As is evident from equation (1) above, by purposefully selecting the coefficients to be unity, the need for multipliers is eliminated. Further, by selecting the scaling factors to be inverse powers of 2, e.g., $2^{-1} = 0.5$, $2^{-2} = 0.25$, scaling is accomplished simply by redefining a bit as the most significant bit in the digital word in the signal.

Because of its simplicity, the preferred embodiment of the invention overcomes many of the problems associated with multipliers present with the recursive digital filters of the prior art. As a consequence of the lack of a multiplier requirement, the digital input data rate to the filter can be substantially increased with little detrimental affect on the desirable filter characteristics of the invention.

DESCRIPTION OF THE PREFERRED EMBODIMENT

Figure 1:
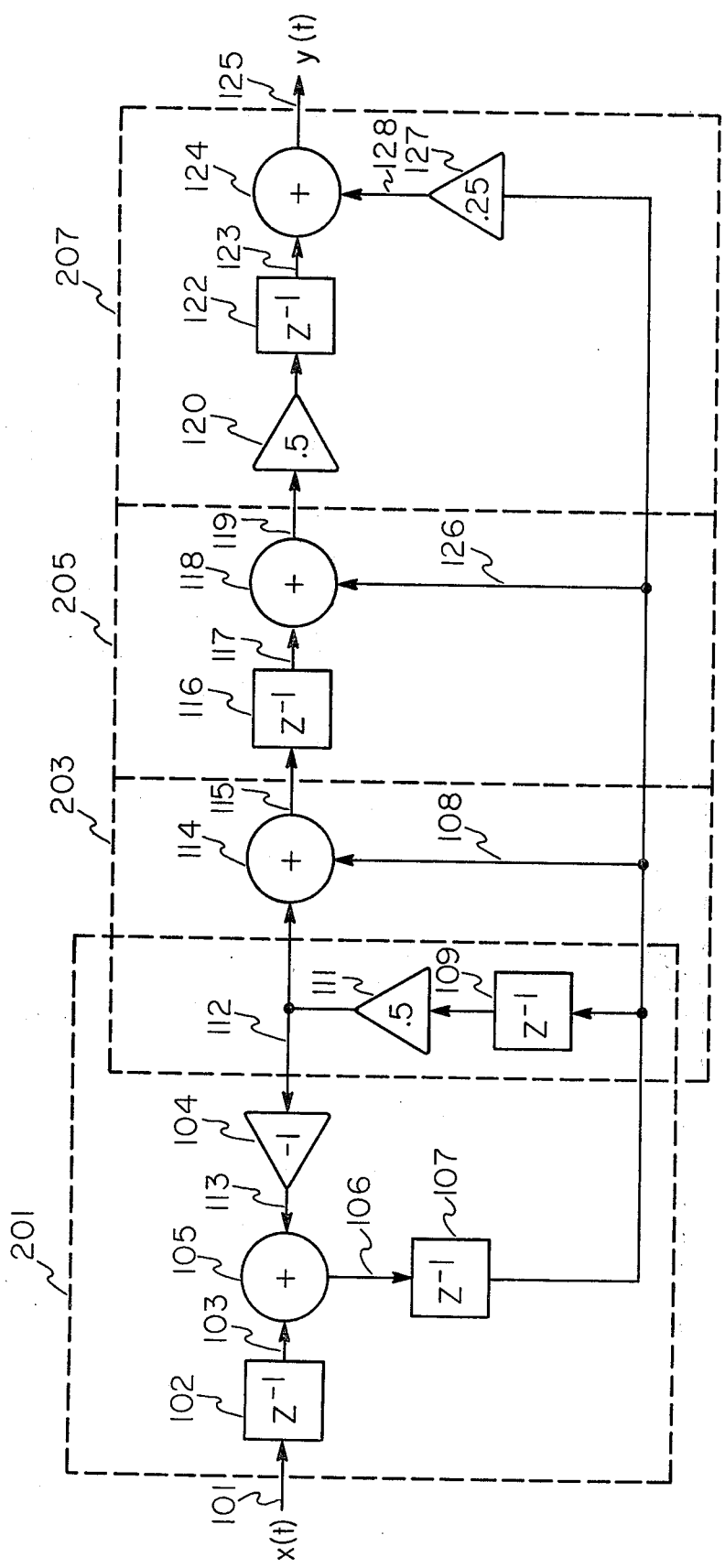
FIG. 1 shows a block diagram of the preferred embodiment of the invention with $n = 3$ and $A = 1$ in the transfer function $H(z)$.

In FIG. 1, a section of a low-pass digital filter in accordance with the preferred embodiment of the invention comprises a feedback section 201 and a plurality of feedforward sections 203, 205, and 207. The signals in the filter are delayed by one clocking period with each storage register.

The feedback section 201 comprises an adder 105 which accepts a digital signal representative of $x(t)$ on an input path 103 after the signal has been delayed by a storage register 102. The adder 105 digitally sums the delayed input signal with a feedback signal on an input path 113 to provide a first signal on an output path 106. The feedback signal comprises the first signal delayed by storage registers 107 and 109 and scaled by negative one-half by scalers 111 and 104, that is, the feedback signal is obtained by taking the complement of the delayed digital first signal after being scaled one-half.

The first feedforward section 203 comprises an adder 114, which accepts the first signal delayed by storage register 107 as an input on a path 108 and the first signal delayed by storage registers 107 and 109 and scaled one-half by scaler 111 as an input on a path 112 to provide a second signal as an output.

The second feedforward section 205 comprises an adder 118 which accepts the second signal delayed by a storage register 116 as an input on a path 117 and the first signal delayed by storage register 107 as an input on a path 126 to provide a third signal as an output on a path 119.

The third feedforward section 207 comprises an adder 124 which accepts the third signal scaled one-half by a scaler 120 and delayed by a storage register 122 as an input on a path 123 and the first signal delayed by storage register 107 and further scaled one-quarter by a scaler 127 as an input on a path 128 to provide an output on a path 125. The output on path 125 is a digital signal representative of an output y(t) of the filter section having a relationship to x(t) defined as follows:

$$Y(z) = \frac{0.25(z^2 + z + 1)(z + 1)}{z^3(z^2 + 0.5)} X(z) \quad (2)$$

where X(z) and Y(z) are z-transforms of x(t) and y(t), respectively, and the other parameters of equation (2) are defined as above in equation (1). In other words, the information bandwidth of the output signal y(t) is made to be one-half that of the input signal x(t) and the pass band gain is made to be substantially unity by making A=1.

By cascading a plurality of sections of the preferred embodiment, the stop band attenuation of the input signal can be made progressively greater.

Mathematically, the above signals can be represented as follows:

The signal on path 108 is:

$$Y_4 = \frac{X}{z^2 + 0.5}, \quad (3)$$

where:
X represents the input signal;
$z = e^{s\Delta t}$ represents a time advance of $\Delta t$ seconds; and
s is the complex variable associated with the LaPlace transform of the filter response.

The signal on path 117 is:

$$Y_6 = Y_4(1 + 0.5z^{-1})z^{-1}, \quad (4)$$

where the parameters are defined as above. The resultant signal from storage register 122 is:

$$Y_8 = 0.5(Y_4 + Y_6)z^{-1} = 0.5Y_4(1 + z^{-1} + 0.5z^{-2})z^{-1}, \quad (5)$$

where the parameters are defined as above. Finally, the output signal is:

$$Y = Y_8 + 0.25Y_4, \quad (6)$$

where the parameters are defined as above.

Combining the above expressions together, the expression for the output signal can be reduced to the following:

$$Y = \frac{0.25(z^2 + z + 1)(z + 1)}{z^3(z^2 + 0.5)} X. \quad (7)$$

Figure 2:
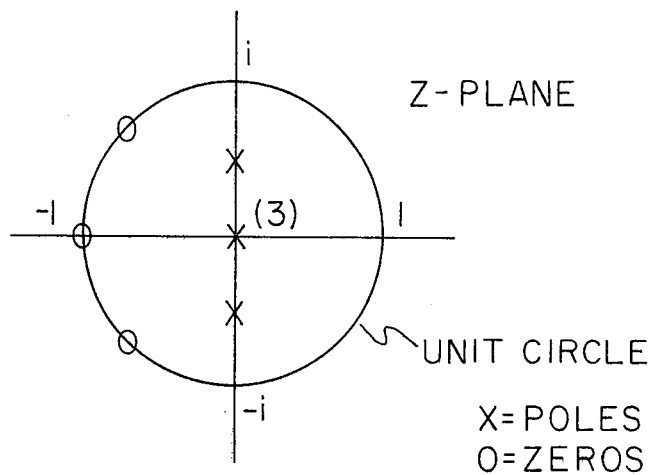
FIG. 2 shows the filter characterstics of the invention in terms of poles and zeroes depicted in the z-plane.
Figure 3:
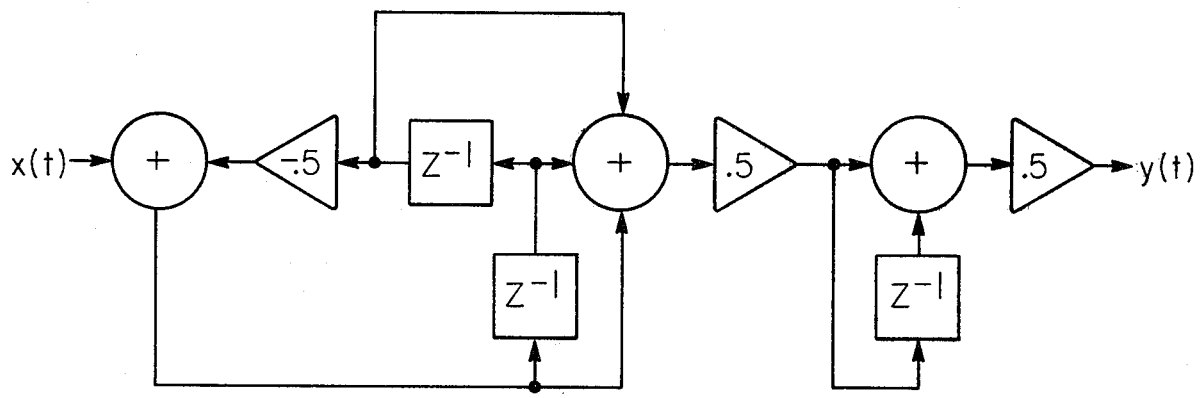
FIG. 3 shows a block diagram of an alternate embodiment of the invention with $n = 1$ and $A = 1$.

The poles of this function are at $z=0$ and $\pm i\sqrt{0.5}$, and its zeroes are at $z=-1$ and $-0.5 \pm i\, 0.5\sqrt{3}$. Graphically, they can be represented on the z-plane as in FIG. 2.

It is apparent to those skilled in the art that the disclosed recursive digital filter may be modified and assume numerous embodiments other than the preferred form specifically set out and described above. This is apparent by viewing the transfer function of equation 1 as a combination of factors $H_0(z)$, $H_1(z)$, and $H_2(z)$ of $H(z)$. These factors are separate transfer functions that define feedback and feedforward circuits that can be implemented differently. For example, if, $$H(z) = BH_0(z)H_1(z)H_2(z), \quad (8)$$

where H(z) is as defined in equation 1, n=3 and B=0.25, then $$H_0(z) = \frac{z^2}{z^2 + 0.5}, \quad (9)$$

$$H_1(z) = \frac{z + 1}{z}, \text{ and} \quad (10)$$

$$H_2(z) = \frac{z^2 + z + 1}{z^2}. \quad (11)$$

Figure 4:
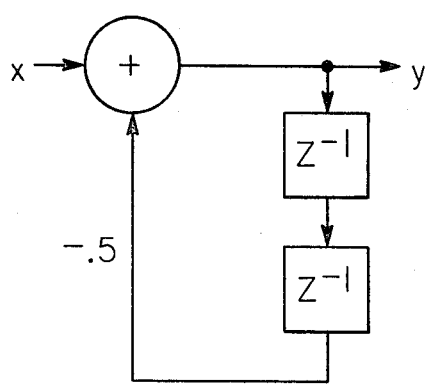
FIG. 4 shows a feedback circuit with a transfer function of $H_0(z)$.
Figure 5:
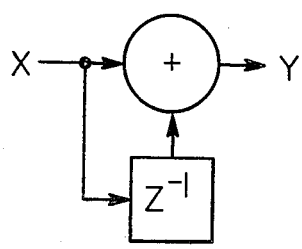
FIG. 5 shows a feedforward circuit with a transfer function of $H_1(z)$.
Figure 6:
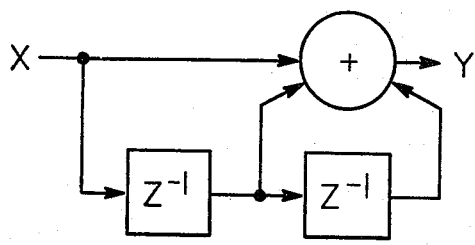
FIGS. 6–9 show examples of a feedforward circuit with a transfer function of $H_2(z)$.
Figure 7:
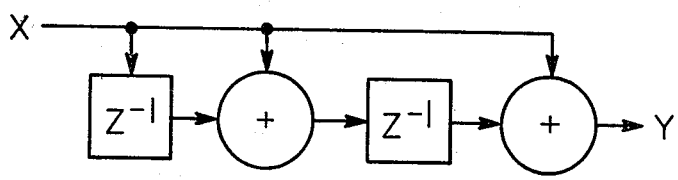
Figure 8:
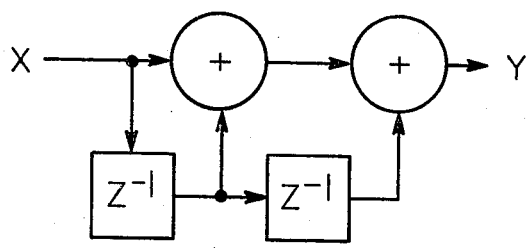
Figure 9:
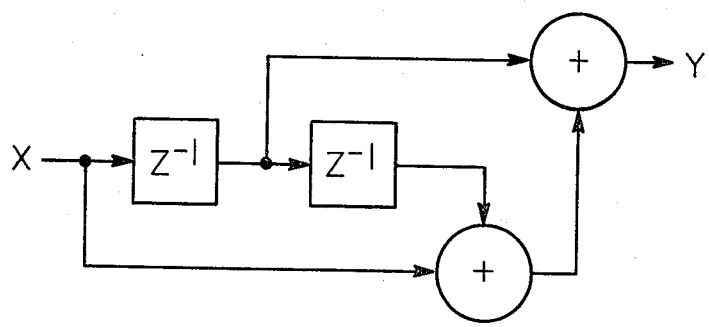
Figure 10:
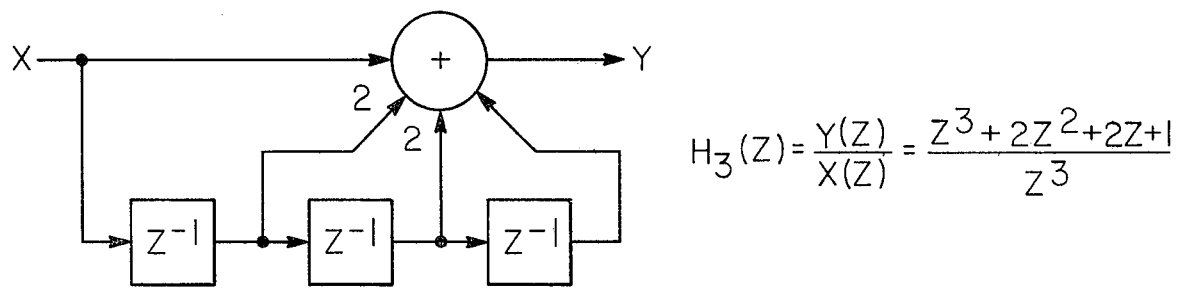
FIGS. 10–18 show examples of a feedforward circuit with a transfer function of $H_3(z)$.
Figure 11:
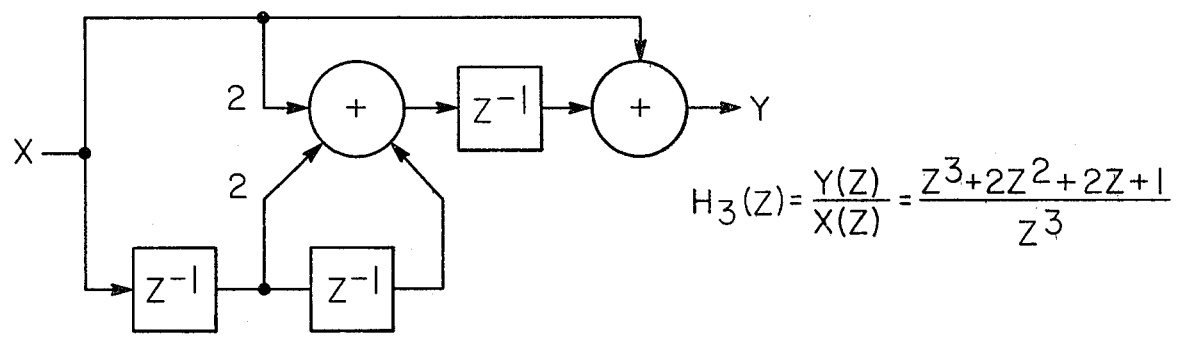
Figure 12:
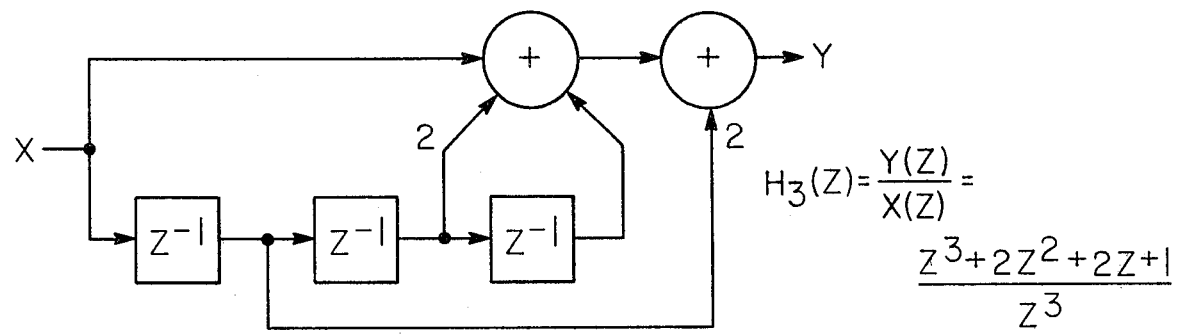
Figure 13:
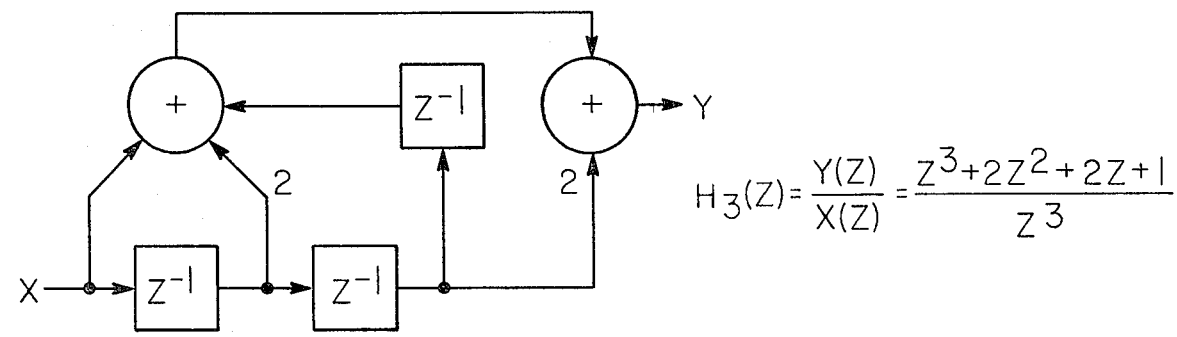
Figure 14:
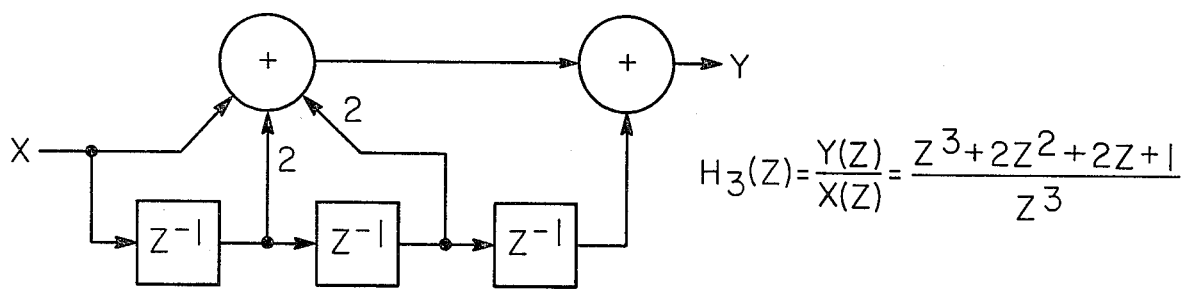
Figure 15:
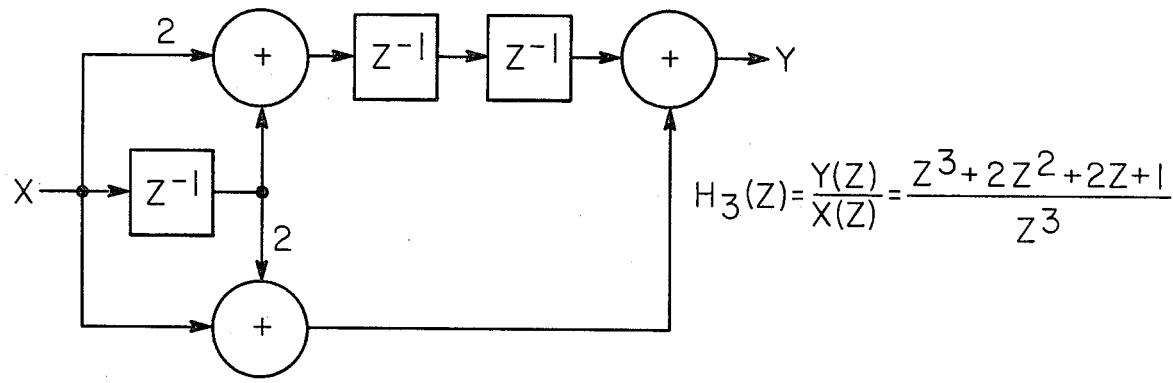
Figure 16:
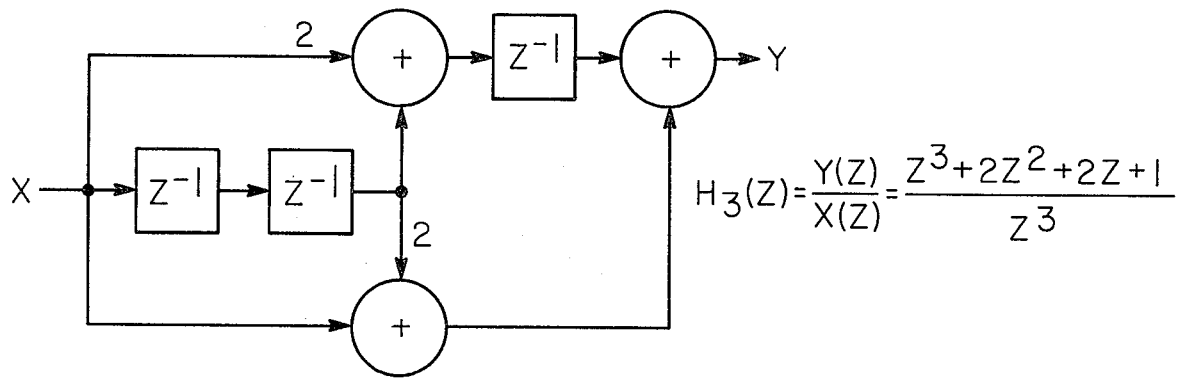
Figure 17:
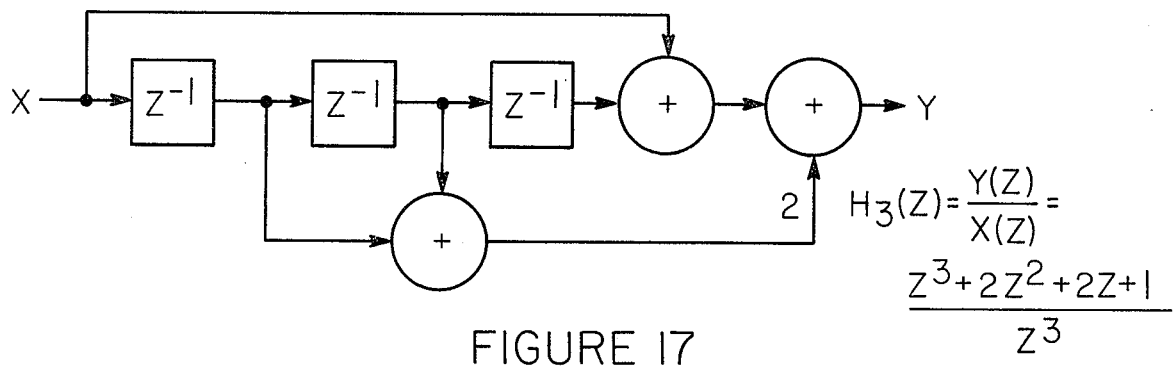
Figure 18:
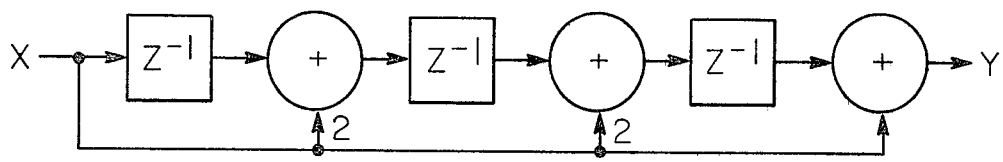

$H_0(z)$ then defines a feedback circuit, and $H_1(z)$ and $H_2(z)$ define feedforward circuits. For the factors of H(z) defined in this example, $H_0(z)$ can be implemented by a feedback circuit as shown in FIG. 4. It is substantially the same circuit as circuit 201 of FIG. 1 less an input storage register 102 for delay. Further, $H_1(z)$ can be implemented by a feedforward circuit as shown in FIG. 5. It is substantially the same circuit as circuit 203 of FIG. 1 less a scaler 111. Finally, $H_2(z)$ can be implemented by feedforward circuits as shown in FIGS. 6–9, among others. A scaler for B can be cascaded to the circuits of $H_0(z)$, $H_1(z)$, and $H_2(z)$ to fulfill the condition for equation (8).

Since H(z) is a linear shift-invariant system (see Oppenheim and Schafer, *Digital Signal Processing*, Prentice-Hall, 1975, Chap. 1), a combination of $H_0(z)$, $H_1(z)$, and $H_2(z)$ in any order yields the same H(z). In other words, $$\begin{aligned}H(z) &= H_0(z)H_1(z)H_2(z) \\ &= H_1(z)H_0(z)H_2(z) \\ &= H_1(z)H_2(z)H_0(z) \\ &= H_2(z)H_1(z)H_0(z) \\ &= H_2(z)H_0(z)H_1(z) \\ &= H_0(z)H_2(z)H_1(z)\end{aligned} \quad (12)$$

Therefore, by cascading various permutations of the feedback and feedforward circuits as exemplified in FIGS. 4–9, other embodiments of the invention are possible.

It should be noted that combining the factors $H_1(z)$ and $H_2(z)$ form a single factor $H_3(z)$, that is, $$H_3(z) = H_1(z)H_2(z) = \frac{z^3 + 2z^2 + 2z + 1}{z^3}, \quad (13)$$

further embodiments of the recursive digital filter using a combination of $H_0(z)$ and $H_3(z)$ for $H(z)$ are then possible. That is, $$H(z) = BH_0(z)H_3(z) = BH_3(z)H_0(z). \quad (14)$$

Examples of possible ways to implement $H_3(z)$ are shown in FIGS. 10–18. In short, by cascading permutations of the feedback and feedforward circuits defined by the above-exemplified factors of equation (1), viz., equation (12) and equation (14), many different embodiments of the invention are possible. All, however, have the system transfer function of equation (1) to provide the present recursive digital filter in accordance with the invention.

Figure 19:
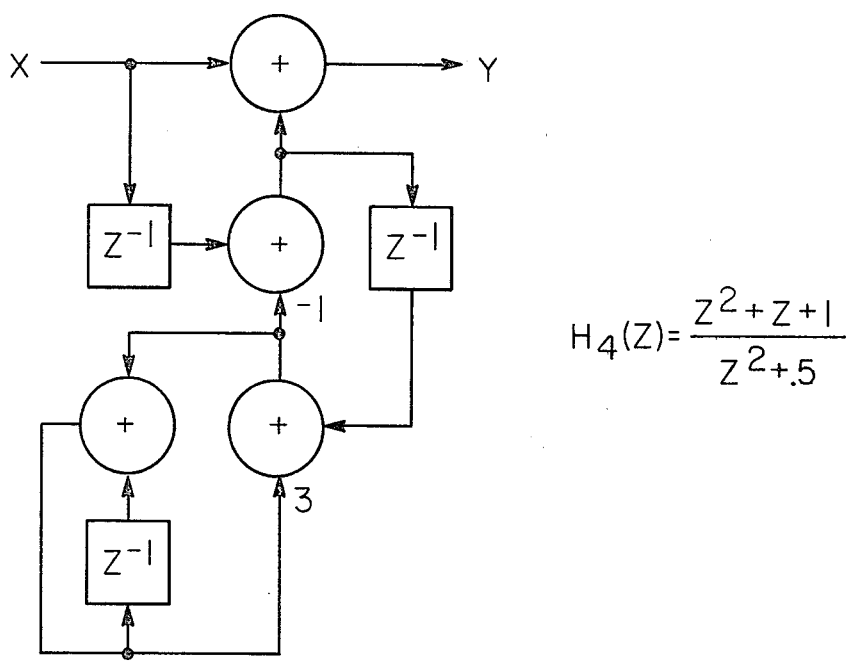
FIGS. 19–21 show examples of further embodiments.

Still other ways of implementing the transfer function of $H(z)$ in equation (1) can be accomplished by expanding the transfer function in a continued fraction form and implementing the expanded fractions. For instance, the transfer function $H(z)$ can be expanded as follows:

$$H(z) = B(1 + z^{-1})\left(\frac{1 + z^{-1} + z^{-2}}{1 + 0.5z^{-2}}\right), \quad (15)$$

where the last quantity can be expanded as follows:

$$H_4(z) = \frac{1 + z^{-1} + z^{-2}}{1 + 0.5z^{-2}} \quad (16)$$

$$= 1 + \frac{z^{-1}}{1 + \frac{z^{-1}}{1 - \frac{3}{1 - z^{-1}}}}$$

and B is a selected scaling factor. $H_4(z)$ can be implemented as a combination feedback-feedforward circuit as shown in FIG. 19.

Figure 20:
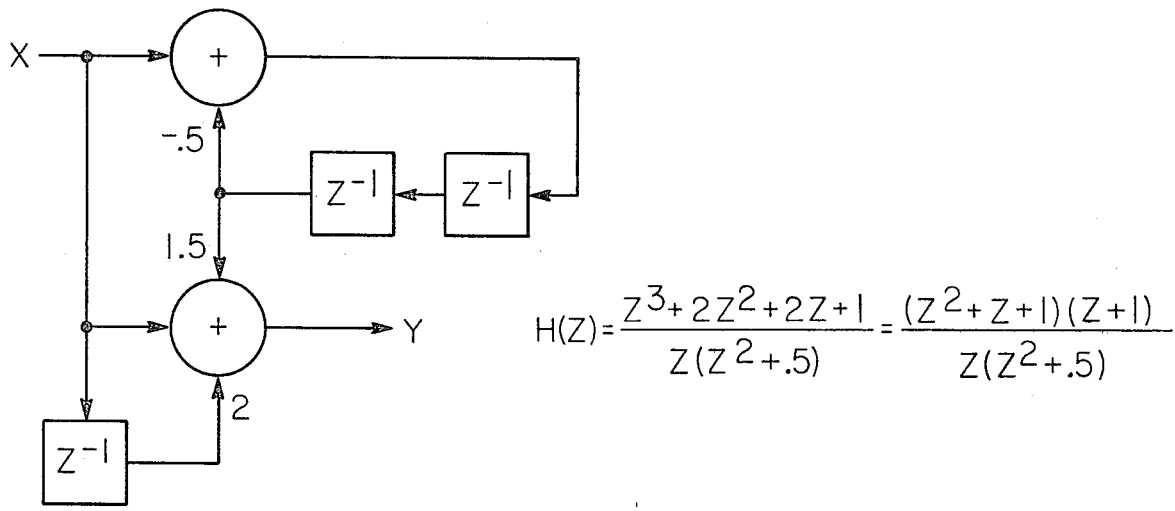

FIG. 20 shows still another example of implementing the transfer function of equation (1). This particular topography of the transfer function is derived from expanding the equation into a partial fraction:

$$H(z) = \frac{1 + 2z^{-1} + 2z^{-2} + z^{-3}}{1 + 0.5z^{-2}} \quad (17)$$

$$= 1 + 2z^{-1} + \frac{1.5z^{-2}}{1 + 0.5z^{-2}}.$$

In passing, it should be mentioned that it is possible to factor the second order numerator or denominator polynominals into first order terms and to combine these terms in various ways. For example, $H_0(z)$ can be expanded as follows:

$$H_0(z) = \frac{1}{1 + 0.5z^{-2}} \quad (18)$$

$$= \frac{1}{(1 + i\sqrt{.5}\,z^{-1})(1 - i\sqrt{.5}\,z^{-1})}$$

$$= \frac{0.5}{1 + i\sqrt{.5}\,z^{-1}} + \frac{0.5}{1 - i\sqrt{.5}\,z^{-1}}.$$

Figure 21:
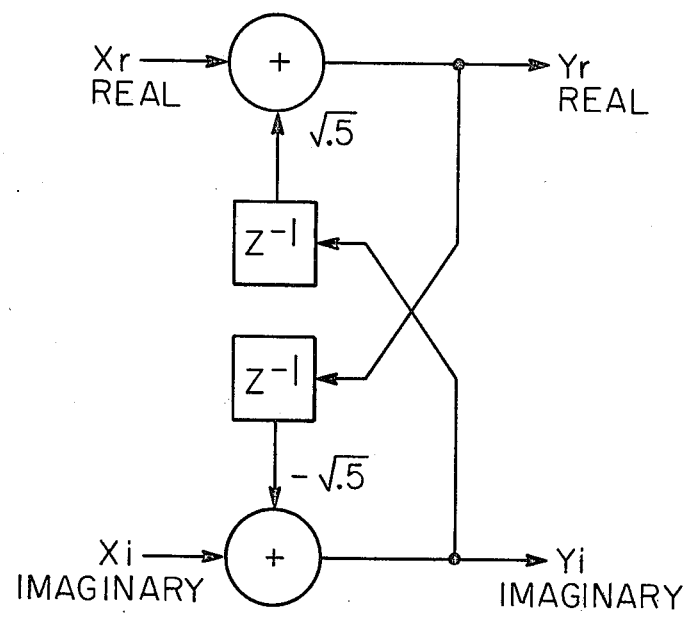

The implementation of these factors is illustrated in FIG. 21. For this configuration, however, the time data are complex having both real and imaginary parts. Also, the scaling coefficients are irrational numbers instead of simple integers. For these reasons, implementation of the transfer function by this method does not have the advantages of the invention as when implemented in accordance with the other methods described earlier and hence may not contitute a preferred embodiment.

I claim:

1. An apparatus for filtering a digital input signal representative of a sequence of substantially equally-spaced samples of a signal x(t) comprising:

first combining means for providing a first signal in response to the combining of a feedback signal and said digital input signal;

feedback means coupled to said first combining means for providing said feedback signal in response to said first signal;

feedforward means coupled to said first combining means for delaying and scaling by selected values said first signal to provide a plurality of feedforward signals; and second combining means coupled to said feedforward means for producing a filtered digital output signal representative of a signal y(t) having an information bandwidth substantially one-half that of the signal x(t) in response to selected combinations of said feedforward signals and having a transfer function H(z) as the combination of signals from said first and second combining means, feedback means, and feedforward means, where:

$$H(z) = B\frac{(z^2 + z + 1)(z + 1)}{z^n(z^2 + 0.5)};$$

$z = e^{s\Delta t}$, which represents a time advance of $\Delta t$ seconds; s is the complex variable of the LaPlace transform; B is a selected scaling; and n is a selected integer.

2. The apparatus as in claim 1 wherein:

(a) said feedback means comprises a first delay-scaler means for providing said feedback signal and said feedback signal is a representation of the complement of said first signal delayed and scaled one-half;

(b) said feedforward means comprises:

second delay-scaler means for providing a first feedforward signal in response to said first signal, said first feedforward signal being a representation of said first signal delayed and scaled one-half;

first delay means for providing a second feedforward signal in response to said first signal; and third delay-scale means for providing a third feedforward signal in response to said first signal, said third feedforward signal being representative of said first signal delayed and scaled one-quarter; and (c) said second combining means comprises:

first summer means for summing said first and second feedforward signals to provide a second signal;

second delay means coupled to the output of said first summer for delaying said second signal;

second summer means coupled to said second delay means for summing said delayed second signal and said second feedback signal to provide a third signal;

fourth delay-scale means coupled to said second summer for providing a fourth signal representative of said third signal delayed and scaled one-half; and third summer means coupled to said fourth delay-scale means for summing said fourth signal and said third feedforward signal to provide said filter digital output signal.

3. An apparatus for filtering a digital input signal comprising:

feedback circuit means having a transfer function of $H_0(z)=z^r/(z^2+0.5)$ for providing an output signal in response to an input signal, wherein r is a selected integer;

first feedforward circuit means having a transfer function of $H_1(z)=(z+1)/z^s$ for providing an output signal in response to an input signal, wherein s is a selected integer;

second feedforward circuit means having a transfer function of $H_2(z)=(z^2+z+1)/z^t$ for providing an output signal in response to an input signal, wherein t is a selected integer;

scaling circuit means for providing an output signal representative of an input signal scaled by a selected factor B; and combination of said feedback, feedforward, and scaling circuit means coupled in series in a selected order to provide a circuit for a recursive digital filter having the transfer function:

$$H(z) = B \frac{(z^2 + z + 1)(z + 1)}{z^n(z^2 + 0.5)},$$

wherein $n=(s+t)-r$.

4. An apparatus for filtering a digital input signal comprising:

feedback circuit means having a transfer function of $H_0(z)=z^r/(z^2+0.5)$ for providing an output signal in response to an input signal, wherein r is a selected integer;

third feedforward circuit means having a transfer function of $H_3(z)=(z^3+2z^2+2z+1)/z^s$ for providing an output signal in response to an input signal, wherein s is a selected integer;

scaling circuit means for providing an output signal representative of an input signal scaled by a selected factor B; and combination of said feedback, feedforward, and scaling circuit means coupled in series in a selected order to provide a circuit for a recursive digital filter having the transfer function:

$$H(z) = B \frac{(z^2 + z + 1)(z + 1)}{z^n(z^2 + 0.5)},$$

wherein $n=s-r$.

5. An apparatus for filtering a digital input signal comprising:

first feedforward circuit means having a transfer function of $H_1(z)=(z+1)/z^s$ for providing an output signal in response to an input signal, wherein s is a selected integer;

fourth feedback-feedforward circuit means having a transfer function of $H_4(z)=z^r(z^2+z+1)/(z^2+0.5)$ for providing an output signal in response to an input signal, wherein r is a selected integer;

scaling circuit means for providing an output signal representative of an input signal scaled by a selected factor B; and combination of said first feedforward and said fourth feedback-feedforward circuit means coupled in series in a selected order to provide a circuit for a recursive digital filter having the transfer function:

$$H(z) = B \frac{(z^2 + z + 1)(z + 1)}{z^n(z^2 + 0.5)},$$

wherein $n=s-r$.

* * * * *

UNITED STATES PATENT AND TRADEMARK OFFICE
CERTIFICATE OF CORRECTION

PATENT NO. : 4,317,092
DATED : February 23, 1982
INVENTOR(S) : Ronald W. Potter

It is certified that error appears in the above-identified patent and that said Letters Patent are hereby corrected as shown below:

Column 2, line 18, ".n" should read -- n --.

Column 7, line 17, that portion of the equation reading "/$z^2$" should read --/$z^s$--.

Signed and Sealed this

Twelfth Day of October 1982

[SEAL]

Attest:

Attesting Officer

GERALD J. MOSSINGHOFF
Commissioner of Patents and Trademarks